United States Patent
Shimizu et al.

[11] Patent Number: 5,583,878
[45] Date of Patent: Dec. 10, 1996

[54] SEMICONDUCTOR OPTICAL DEVICE

[75] Inventors: Hitoshi Shimizu; Michinori Irikawa, both of Yokohama, Japan

[73] Assignee: The Furukawa Electric Co., Ltd., Tokyo, Japan

[21] Appl. No.: 264,570

[22] Filed: Jun. 23, 1994

[30] Foreign Application Priority Data

Jun. 23, 1993 [JP] Japan .................. 5-177459

[51] Int. Cl.$^6$ ..................................... H01S 3/19
[52] U.S. Cl. ............................................. 372/45
[58] Field of Search ........................... 372/45, 44, 43

[56] References Cited

U.S. PATENT DOCUMENTS

| | | | |
|---|---|---|---|
| 5,272,712 | 12/1993 | Arimoto et al. | 372/45 |
| 5,289,486 | 2/1994 | Iga et al. | 372/45 |
| 5,383,213 | 1/1995 | Irikawa et al. | 372/46 |

*Primary Examiner*—James W. Davie
*Attorney, Agent, or Firm*—Jacobson, Price, Holman & Stern

[57] ABSTRACT

There is provided a semiconductor optical device having remarkable features including a low threshold current, a high light emitting efficiency, a high and stable optical output, a fast modulation capability, a large gain characteristics, resistance against oxidization, a high quality and a high degree of processibility. The device comprises a pair of optical confinement layers 13, 17 and a pair of cladding layers 12 and 18 arranged on and under an active layer 15 to produce a SCH structure, at least one of said optical confinement layers 13 and 17 comprising multiquantum barrier (MQB) structures 14, 16 as part thereof. If the active layer 15 is of multiquantum well type, the barrier layer 15a of the active layer 15 also comprises a multiquantum barrier (MQB) structure. With such an arrangement, the barrier height of the barrier layer 15a and the optical confinement layers 13, 17 can be made very high relative to the active layer 15 (well layer 15b). Such a semiconductor optical device can effectively suppress any overflow of carriers from the active layer 15 (well layer 15b) into the optical confinement layers 13, 17 and further into the cladding layers so that it shows a low and stable threshold current, an enhanced optical output power, an improved high-speed modulation performance and a quick responsiveness.

12 Claims, 4 Drawing Sheets

SEMICONDUCTOR OPTICAL DEVICE

BACKGROUND OF THE INVENTION

1. Field of the Invention

This invention relates to a semiconductor optical device to be suitably used as for optical telecommunications, optical instrumentation, optical data processing and other areas of application and, more particularly, it relates to a semiconductor laser device that effectively operates in an oscillation wavelength band from 0.6 to 2.0 μm.

2. Prior Art

It is critically important for a semiconductor laser device to have a reduced threshold current (threshold current density) for laser oscillation in order to operate stably and continuously with an enhanced output level. A technique currently used to reduce the threshold current density is to provide a large optical confinement coefficient relative to the active layer.

FIGS. 10 through 12 respectively illustrate the energy band diagrams for conductive band for known semiconductor laser devices of three different types.

FIG. 10 shows the conduction band of a multiquantum well type semiconductor laser device, which comprises an MQW (Multi Quantum Well) active layer 1, upper and lower optical confinement layers 2 and 3 sandwiching the active layer 1, an upper p-clad layer 5 and a lower n-clad layer 4 arranged respectively on the upper optical confinement layer 3 and under the lower optical confinement layer 2 to form an SCH (Separate Confinement Hetero) structure.

An SCH structure can provide a large optical confinement coefficient for the MQW active layer 1 and reduce the threshold current.

The multiquantum well semiconductor laser device illustrated in FIG. 11 comprises superlattice optical confinement layers 2 and 3 in the form of equiperiodically arranged thin layers in order to raise the potential height against electrons in the quantum walls while maintaining the optical confinement coefficient to the same level as that of conventional SCH.

As the quantum wells of the superlattice optical confinement layer of the semiconductor laser device of FIG. 11 have a reduced well thickness, it shows a high confinement energy for electrons there, which may be eventually be cut off to fall into a condition where no quantum state exists.

The multiquantum well semiconductor laser device shown in FIG. 12 additionally comprises a MQB (Mutli Quantum Barrier) 6 inserted between the optical confinement layer 3 and the p-clad layer 5.

The semiconductor laser device of FIG. 12 suppresses any overflow of carriers from the optical confinement layer into the upper clad layer (p-clad layer) with the high barrier effect produced in the MQB 6 due to the interference effect of electron waves.

PROBLEMS TO BE SOLVED BY THE INVENTION

The document listed below, or Document 1, points out that the MQW type semiconductor laser of FIG. 10 has a disadvantage of overflow of electrons from the quantum wells to the optical confinement layer, because of a low potential height of barriers and optical confinement layers against the quantum wells. If carriers overflow to a large extent, the performance of laser device is deteriorated to show a raised threshold current, a saturated optical output, a reduced response speed and other undesirable phenomena.

These phenomena are particularly remarkable in semiconductor laser devices having a large mirror loss and a high threshold carrier density such as long wavelength region laser devices, particularly surface emitting laser devices and laser devices having a short cavity with a length of less than 300 μm.

Document 1

Proceedings on the 13th IEEE International Semiconductor Laser Devices Conference (1992), pp. 140 and 142

The MQW type semiconductor laser device of FIG. 11 seems to be free from the problems of the device of FIG. 10 because the quantum wells are made to have a large barrier height, while remaining a large optical confinement coefficient, because of the superlattice SCH structure.

However, such a superlattice SCH structure must have the total thickness of optical confinement layers of 400 nm, requiring a total of approximately two hundred interfaces, if each combined well layer/barrier layer has a thickness of 2 nm/2 nm. This may be accompanied by troubles such as recombination centers appearing on heterointerfaces that degrade the performance of the device.

Additionally, such a superlattice SCH structure requires a large load to epitaxial growth machines, because it requires so frequent ON/OFF operations of material gas lines or cell shutters, if it is formed by a known epitaxial growth method such as MOCVD or MBE.

The MQB type semiconductor laser device illustrated in FIG. 12 was fabricated and reported to suppress the phenomenon of overflowing carriers observed in devices having an oscillation wavelength band of 0.6 to 0.65 μm, as shown on Document 2 below. However, it is obvious from Document 1 listed above that it cannot sufficiently suppress the overflow of carriers from the active layer into the optical confinement layers, nor does it operate satisfactorily in terms of low threshold current, high optical output power level and high speed response.

Document 2

Proceeding on the 13th IEEE International on Semiconductor Laser Conference (1992), pp. 154 and 158

OBJECT OF THE INVENTION

In view of the above technological problems, it is therefore an object of the present invention to provide semiconductor optical devices, especially semiconductor laser diodes that can effectively suppress any overflow of carriers from the quantum well layer and operate with a low threshold current power, a high light emission efficiency and a high and stable optical output level as well as a high speed modulation capability and a high gain performance, while it is free from oxidation and can be manufactured with a simplified process.

SUMMARY OF THE INVENTION

According to the invention, the above object and other objects of the invention are achieved by providing a semiconductor optical device comprising an active layer, a pair of optical confinement layers and a pair of cladding layers formed on a semiconductor substrate, said active layer being sandwiched by said upper and lower optical confinement layers, and said pair of cladding layers to form an SCH structure, characterized in that said optical confinement layers have multiquantum barrier (MQB) structures as part thereof.

For the purpose of the present invention, the SCH structure may be a GRIN (graded Index)-SCH structure.

For the purpose of the present invention, the active layer may be a bulk active layer or, alternatively, it may be of the SQW (Single Quantum Well), MQW, single strained quantum well, strained multilayer quantum well or strain-compensating multiquantum well type.

If the active layer is of the multiquantum well type, the barrier layers of said MQW may also comprise multiquantum barrier (MQB) structures.

For the purpose of the invention, said multiquantum barrier (MQB) structures may comprise a strained layer superlattice structure.

For the purpose of the present invention, the multiquantum barrier (MQB) structures comprised in the optical confinement layers as part thereof may comprise a plurality of barrier layers having an energy band gap that decreases as it comes closer to the active layer.

For the purpose of the present invention, the barrier layers comprised in the multiquantum barrier (MQB) structures as part thereof may have a band gap greater than those of the areas of the optical confinement layers other than the MQB structure.

If both the clad layers and the MQB layers of a semiconductor laser device according to the invention contains aluminum, the barriers of MQB layers preferably contain aluminum in average lower than the aluminum concentration of the clad layers.

In a preferred mode of carrying out the present invention, if a semiconductor laser device according to the invention operates with a laser wavelength region of 0.7 to 1.2 μm and the cladding layers are formed on a GaAs semiconductor substrate and made of $Al_xGa_{1-x}As$ that latticematches with the substrate, the optical confinement layers are made of $Al_yGa_{1-y}As$ ($0 \leq y \leq x$), the barrier layers of MQB layers are made of $In_zAl_wGa_{1-z-w}As$ ($0 \leq z < 1$, $0 \leq w < x$) and the MQB well layers are made of $In_aAl_bGa_{1-a-b}As$ ($0 \leq a < 1$, $0 \leq b < x$) having a band gap smaller than that of the barriers layers of MQB.

In another preferred mode of carrying out the present invention, if a semiconductor laser device according to the invention operates with an oscillation wavelength band of 0.7 to 1.2 μm and the clad layers are formed on a GaAs semiconductor substrate and made of $Ga_xIn_{1-x}As_yP_{1-y}$ that latticematches with the substrate, the optical confinement layers are made of $Ga_zIn_{1-z}As_wP_{1-w}$, the barriers of MQB layers are made of $Ga_aIn_{1-a}As_bP_{1-b}$ and the wells of MQB layers are made of $Ga_cIn_{1-c}As_dP_{1-d}$ having a band gap smaller than that of the barriers of MQB layers.

In still another preferred mode of carrying out the present invention, if a semiconductor laser device according to the invention operates with an oscillation wavelength band of 0.6 to 0.65 μm and the clad layers are formed on a GaAs semiconductor substrate and made of $Al_xGa_{0.5-x}In_{0.5}P$ that latticematches with the substrate, the optical confinement layers are made of $Al_zGa_wIn_{1-z-w}P$ ($0 \leq z \leq x$), the barriers of MQB layers are made of $Al_aGa_bIn_{1-a-b}P$ ($0 \leq a \leq x$) and the wells of MAB layers are made of $Ga_cIn_{1-c}As_DP_{1-D}$ having a band gap smaller than that of the barriers of MQB layers.

In still another preferred mode of carrying out the present invention, if a semiconductor laser device according to the invention operates with an oscillation wavelength band of 1.0 to 2.0 μm and the clad layers are formed on an InP semiconductor substrate and made of $In_xAl_yGa_{1-x-y}As_zP_{1-z}$ that latticematches with the substrate, the optical confinement layers are made of $In_aAl_bGa_{1-a-b}As_cP_{1-c}$, the barriers of MQB layers are made of $In_DAl_EGa_{1-D-E}As_FP_{1-F}$ and the wells of MQB layers are made of $In_tAl_uGa_{1-t-u}As_vP_{1-v}$ having a band gap smaller than that of the barriers of MQB layers.

Function

A semiconductor laser device according to the invention comprises an active layer, optical confinement layers and clad layers, of which the optical confinement layers by turn comprise multiquantum barrier (MQB) structures as part thereof. With such an arrangement, the barrier height of the optical confinement layers against electrons in the quantum well layers of the active layer can be made high without modifying the optical confinement coefficient for the active layer so that overflow of carriers from the active layer into the optical confinement layers can be effectively suppressed.

If the SCH structure of a semiconductor laser device is a GRIN (graded Index)-SCH structure, the internal electric field within the GRIN region can accelerate carriers in the active layer so that the carrier transport process and the device can have a high speed modulation capability and a large gain.

It is well known that the active layer of a semiconductor laser device has a single quantum well (SQW) type or multiquantum well (MQW) type structure including strained SQW or MQW, the laser threshold current of the device is greatly reduced, while raising the efficiency of its optical output to improve the performance of the device.

In this case, further improvement can be realized by applying the structure of this invention.

If the active layer of a semiconductor laser device according to the invention has a multi quantum well (MQW) type structure and its barrier layers have MQB structures, overflow of carriers can be further reduced by high effective barriers of the above MQBs and those of the MQB structures of the optical confinement layers.

If a semiconductor laser device has MQB structures comprising a strained layer superlattice structure, the effective height of the barriers of the MQB structures can be increased because of the existence of the barriers of MQB layers having a larger band gap and the wells of MQB layers having a small band gap formed in the device.

Thus, when a semiconductor laser device according to the invention is used for laser oscillation in a wavelength band of 0.6 to 2.0 μm, the optical output power, the temperature dependence and high-speed modulation performance as well as other important characteristics of the device can be remarkably improved without increasing the threshold current.

Since optical confinement layers of the above described type have a smaller number of interfaces than other optical confinement layers having a superlattice SCH structure, they can prepared with a relatively simplified process and hence a highly reliable semiconductor laser device can be manufactured in a simple manner at reduced cost.

Semiconductor laser devices are often manufactured by using aluminum for the clad and optical confinement layers because of the remarkable effect of the element. Aluminum is particularly effective for increasing the band gap of the barrier layer and the optical confinement coefficient of the device.

On the other hand, aluminum can be easily oxidized to form nonradiative recombination centers which can raise the threshold current of the device and consequently reduce the service life of the device.

If a semiconductor laser device according to the invention comprises clad layers and MQB layers containing aluminum as component, the MQB layers are made to contain aluminum in average to a concentration lower than the aluminum concentration of the clad layers. With such an arrangement, the device can show an improved performance, avoiding undesirable effects of oxidized aluminum.

Now, the present invention will be described in greater detail by referring to a preferred embodiment of the invention and by way of specific examples of the invention.

DETAILED DESCRIPTION OF THE INVENTION

Embodiment

Figure 1:
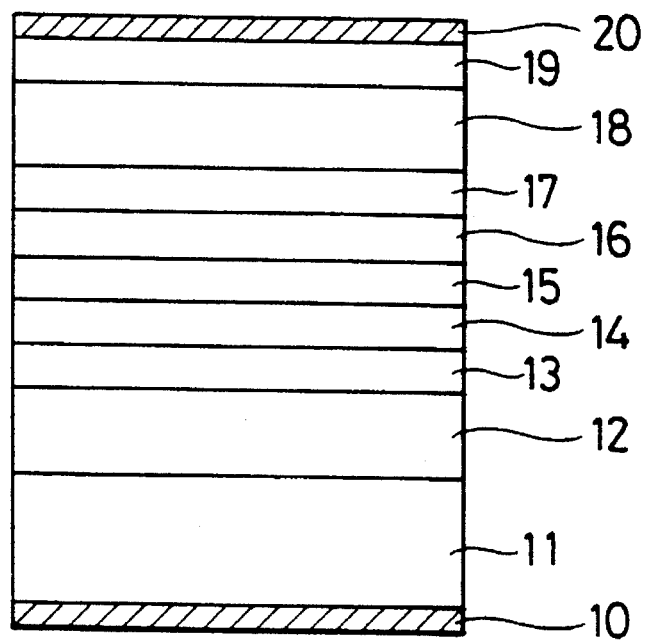
FIG. 1 is a schematic sectional view of an embodiment of semiconductor laser device according to the invention.

FIG. 1 shows a schematic sectional view of a preferred embodiment of semiconductor laser device according to the invention.

Referring to FIG. 1, the embodiment comprises an n-electrode 10, an n-type semiconductor substrate 11, a lower cladding layer 12, a lower optical confinement (OC) layer 13, a lower multiquantum barrier (MQB) structure 14 including barrier layers 14a and well layers 14b, an active layer 15, an upper multiquantum barrier (MQB) structure 16 including barrier layers 16a and well layers 16b, an upper optical confinement (OC) layer 17, an upper cladding layer 18, a contact layer 19 and a p-electrode 20.

The layers are grown on the semiconductor substrate 11 starting in the sequence of the lower clad layer 12, the lower optical confinement layer 13, the lower multiquantum barrier structure 14, the active layer 15, the upper multiquantum barrier structure 16, the upper optical confinement layer 17, the upper clad layer 18 and the contact layer 19, while the n- and p-electrodes are deposited to the lower surface of the semiconductor substrate 11 and the upper surface of the contact layer 19, respectively.

Both the n-electrode 10 and the p-electrode 20 are made of a known conductive material such as Au, Ag, Zn or an alloy thereof. The n-electrode 10 is typically made of a metal alloy selected from AuGe/Ni/Au and Sn/Au, while the p-electrode 20 is typically made of a metal alloy selected from Zn/Au, Be/Au, Cr/Au and Ti/Pt/Au.

The semiconductor substrate 11 is made of GaAs, InP or Si having heteroepitaxial buffer layers while the lower cladding layers 12 is made of a crystal material that lattice-matches with GaAs or InP. The upper cladding layer 18 is ordinarily made of the same material as that of the lower clad layer 12.

If the semiconductor substrate 11 is made of GaAs, a material that latticematches with GaAs is used for the clad layers 12 and 18 and selected from AlGaAs, GaInAsP and AlGaInP system. If, on the other hand, the semiconductor substrate 11 is made of InP, a material that latticematches with InP is used for the clad layers 12 and 18 and selected from InP, InAlAs and InGaAlAs system.

The lower and upper optical confinement (OC) layers 13 and 17 are also made of a material selected from AlGaAs, GaInAsP, AlGaInP, InAlGaAs and InAlGaAsP system.

An MQB is formed by a plurality of pairs of a barrier layer 14a and a well layer 14b in the lower multiquantum barrier structure 14. Likewise, an MQB is formed by a plurality of pairs of barrier layer 16a and a well layer 16b in the upper multiquantum barrier structure 16.

The number of barrier layer/well layer pairs in each MQB can be arbitrarily determined so far as the MQB can construct proper effective barrier. However, if an ordinary case, pair number of four to eight is desirable.

A high effective barrier height can be formed by MQB, if the MQB layer/well layer pairs have different thicknesses.

The materials that can be used for the barrier layers 14a, 16a and the well layers 14b, 16b include AlGaAs, GaInAsP, AlGaInP, InAlGaAs and InAlGaAsP type crystals (mixed crystals), although the well layers 14b, 16b have energy band gaps smaller than those of the barrier layers 14a, 16a.

The multiquantum barrier structure 14 comprises a plurality of barrier layers 14a having an energy band gap that may decrease as it comes closer to the active layer, which will be described hereinafter. This also holds true for the multiquantum barrier structure 16 comprising a plurality of barrier layers 16a. The barrier layers 14a and 16a of the quantum barrier structures 14, 16 may have an energy band gap greater than those of the areas of the optical confinement layers other than the MQB structures. Said multi quantum barrier (MQB) structures 14, 16 may comprise a strained superlattice structure (in-plane compressive strain or in-plane tensile strain: 0.1 to 5%).

The active layer 15 is of the SQW (Single Quantum Well), MQW (Multi Quantum Well) consisting of either of bulk layer, strained single quantum well, strained layer multiquantum well or strain compensated multiquantum well type. The barrier layer of the MQW active layer may also comprise a multiquantum barrier (MQB) structure.

The quantum well type active layer 15 comprises a quantum well layer and a barrier layer having different band gap wavelengths and made of a crystal or mixed crystal material systems such as AlGaAs, GaInAsP, AlGaInP, InAlGaAs or InAlGaAsP system.

The contact layer 19 is typically made of a crystal material of the GaAs or GaInAsP type.

If both the clad layers 12, 18 and the barriers 14a, 16a of the multiquantum barrier structures 14, 16 of a semiconductor laser device according to the invention contain aluminum, the barrier layers 14a, 16a contain aluminum in average within MQB to a concentration lower than the aluminum concentration of the clad layers 12, 18.

A semiconductor laser device according to the invention is prepared by means of a combination of one of the techniques including VPE (vapor phase epitaxy) including MOCVD (metal organic chemical vapor deposition), LPE (liquid phase epitaxy), MBE (molecular beam epitaxy) and CBE (chemical beam epitaxy) and one of the techniques including dry etching including photolithography, wet etching and metal bonding, which are well known in the field of manufacturing semiconductor laser devices.

Now, the present invention will be described further by way of examples where different compositions and characteristics are prescribed for the components of a semiconductor laser device according to the invention.

EXAMPLE 1

Figure 2:
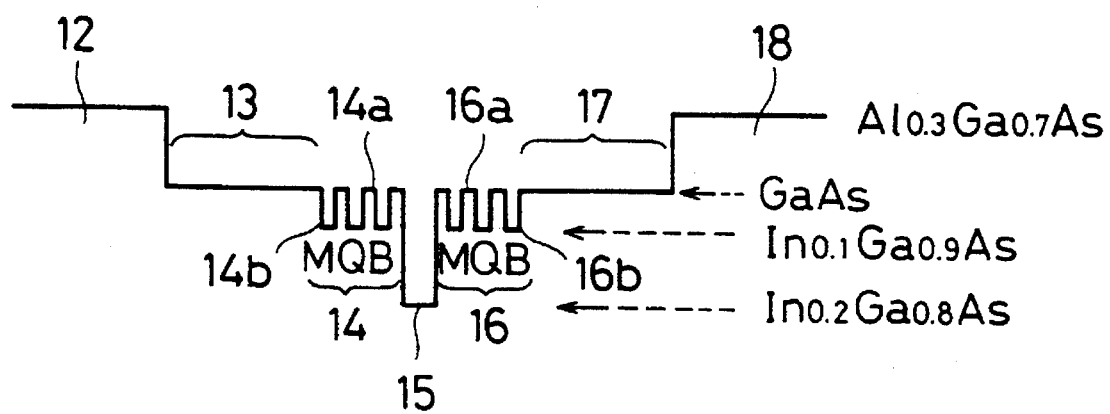
FIG. 2 is a schematic illustration of the energy band diagram for conduction band of the semiconductor laser device of Example 1 as described hereinafter.

In this example, the components of a semiconductor laser device according to the invention have respective compositions as specifically prescribed below. FIG. 2 shows the energy band diagram for conduction band of the device of this example (lasing wavelength: 0.7 to 1.2 μm).

n-electrode 10: AuGe/Ni/Au semiconductor substrate 11: n-GaAs lower clad layer 12: n-$Al_{0.3}Ga_{0.7}As$ lower optical confinement layer 13: GaAs lower multiquantum barrier structure (MQB) 14
    barrier layer 14a: nondoped GaAs (thickness: 6 atom layers)
    well layer 14b: nondoped $In_{0.1}Ga_{0.9}As$ (thickness: 4 atom layers)

active layer 15: $In_{0.2}Ga_{0.8}As$ single quantum well (thickness: 9 nm)

upper multiquantum barrier structure (MQB) 16
    barrier layer 16a: nondoped GaAs (thickness: 6 atom layers)
    well layer 16b: nondoped $In_{0.1}Ga_{0.9}As$ (thickness: 4 atom layers)

upper optical confinement layer 17: GaAs upper clad layer 18: n-$Al_{0.3}Ga_{0.7}As$ contact layer 19:

p-GaAs p-electrode 20: AuZn

The number of barrier layer 14a/well layer 14b pairs of the MQB 14 is 10 and that of barrier layer 16a/well layer 16b pairs of the MQB 16 is also 10.

As the device of Example 1 comprises a lower optical confinement layer 13 and an upper optical confinement layer 17, which constitute SCH structure, they have a large optical confinement coefficient for the active layer 15 and, as they comprise MQBs 14, 16 as part thereof, the device can effectively suppress any overflow of electrons from the active layer 15 into the optical confinement layers 13, 17.

Thus, a semiconductor laser device having a configuration as prescribed in Example 1 has a low threshold current, a high optical output power and a high-speed performance.

EXAMPLE 2

Figure 3:
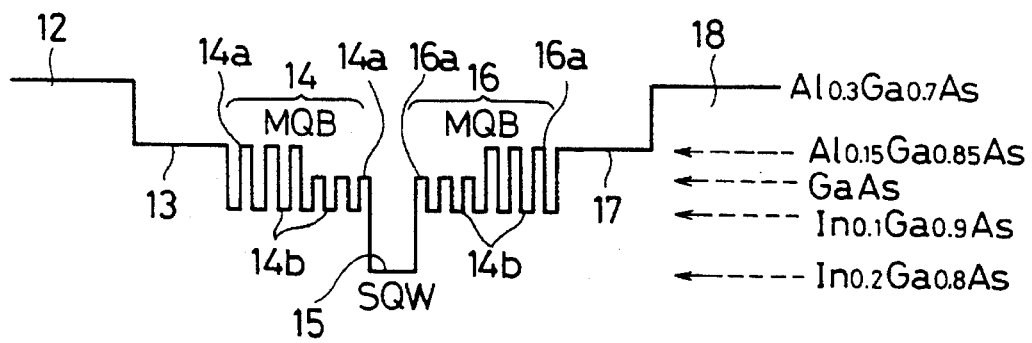
FIG. 3 is a schematic illustration of the energy band diagram for conduction band of the semiconductor laser device of Example 2 as described hereinafter.

FIG. 3 shows the energy band diagram for conduction band of the device of this example (lasing wavelength: 0.7 to 1.2 μm).

In this example, the semiconductor laser device according to the invention have same structure as those described above in Example 1, except for only point that the multiquantum barrier structures 14, 16 contain a plurality of barriers layers having an energy band gap that decreases as it comes closer to the active layer 15.

The barrier layers 14a, 16a of the MQB structures 14, 16 of this example consist of $Al_{0.15}Ga_{0.85}As$ and GaAs.

The semiconductor laser device of Example 2 has the same characteristics as those described above in Example 1. In addition, it can accelerate carriers toward the active layer because it comprises a gradient, it has a larger modulation bandwidth and an improved gain characteristic.

EXAMPLE 3

Figure 4:
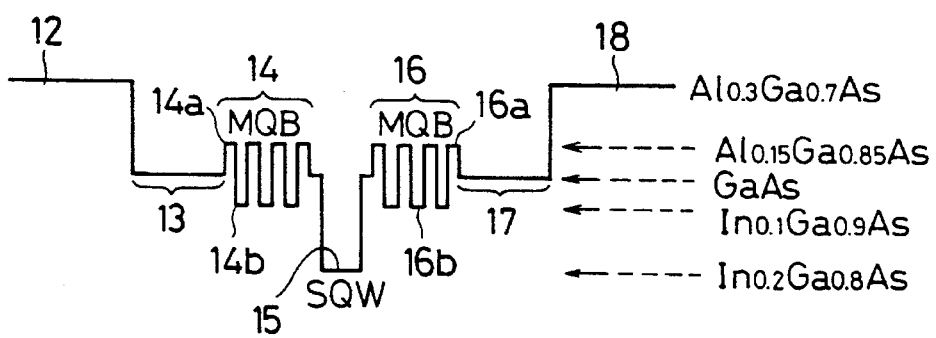
FIG. 4 is a schematic illustration of the energy band diagram for conduction band of the semiconductor laser device of Example 3 as described hereinafter.

FIG. 4 shows the energy conduction band for the device of this example (lasing wavelength: 0.7 to 1.2 μm).

In this example, the semiconductor laser device according to the invention have components same as those described above in Example 1, except for only point that the barrier layers 14a, 16a of the lower and upper multiquantum barrier structures 14, 16 have an energy band gap greater than that of the areas of the optical confinement layers other than the MQB structures.

The barrier layers 14a, 16a of the MQB structures 14, 16 of this example are made of nondoped $Al_{0.15}Ga_{0.85}As$.

The semiconductor laser device of Example 3 has the same characteristics as those described above in Examples 1 and 2. In addition, it has even higher effective barriers and an improved confinement efficiency relative to the active layer 15 so that it has a lowered threshold and an improved light emitting efficiency.

EXAMPLE 4

Figure 5:
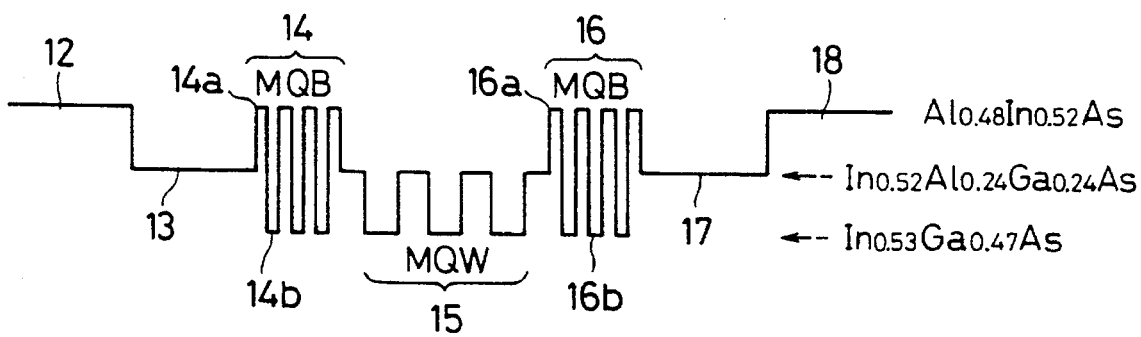
FIG. 5 is a schematic illustration of the energy band diagram for conduction band of the semiconductor laser device of Example 4 as described hereinafter.

FIG. 5 shows the energy conduction band for the device of this example (lasing (wavelength: 1.0 to 2.0 μm).

In this example, the components of a semiconductor laser device according to the invention have respective components as specifically prescribed below.

n-electrode 10: AuGe/Ni/Au semiconductor substrate 11: n-InP lower clad layer 12: n-$Al_{0.48}In_{0.52}As$, doping, $1\times10^{18}$ $cm^{-3}$ lower optical confinement layer 12: n-$In_{0.52}Al_{0.24}Ga_{0.24}As$ lower multiquantum barrier structure (MQB) 14
    barrier layer 14a: nondoped n-$Al_{0.48}In_{0.52}As$ (8 ML×3 layers)+(5 ML×5 layers)
    well layer 14b: nondoped $In_{0.53}Ga_{0.47}As$ (10 ML×3 layers)+(8 ML×2 layers)+(7 ML×2 layers)

active layer (MQW) 15:
well layer: $In_{0.53}Ga_{0.47}As$
barrier layer: $In_{0.52}Al_{0.24}Ga_{0.24}As$
upper multiquantum barrier structure (MQB) 16
barrier layer 16a: nondoped $Al_{0.48}In_{0.52}As$ (8 ML×3 layers)+(5 ML×5 layers)
well layer 16b: nondoped $In_{0.53}Ga_{0.47}As$ (10 ML×3 layers)+(8 ML×2 layers)+(7 ML×2 layers)
upper optical confinement layer 17: p-$In_{0.52}Al_{0.24}Ga_{0.24}As$
upper clad layer 18: p-$Al_{0.48}In_{0.52}As$, doping, $1\times10^{18}$ cm$^{-2}$
contact layer 19: p-$In_{0.52}Ga_{0.47}As$
p-electrode 20: AuZn The semiconductor laser device of Example 4 has the same characteristics as those described above in Example 1. In addition, it has a low aluminum concentration in areas close to the active layer 15 so that it is relatively free from adverse effects of aluminum oxidation. Thus, a semiconductor laser device component as prescribed in Example 4 has a low threshold current, excellent temperature stability and a prolonged life time.

EXAMPLE 5

Figure 6:
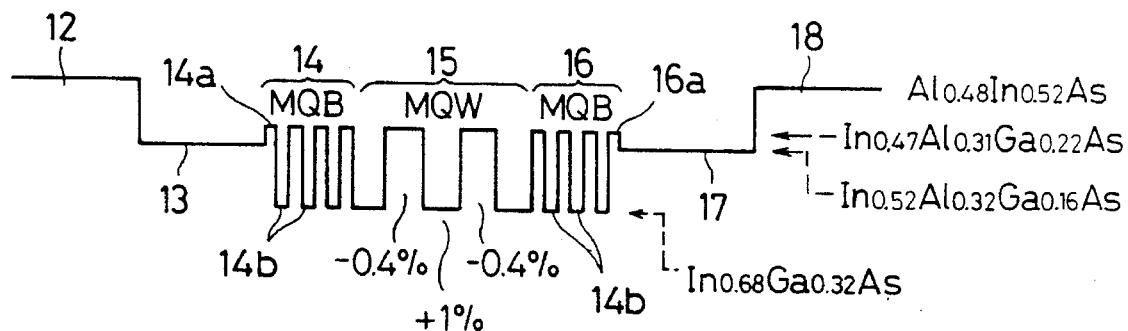
FIG. 6 is a schematic illustration of the energy band diagram for conduction band of the semiconductor laser device of Example 5 as described hereinafter.

FIG. 6 shows the energy conduction band of the device of this example (lasing wavelength: 1.0 to 2.0 μm).

In this example, the well layer of the MQW active layer 15 has a compressive strain of +1%, whereas the barrier layer of the MQW active layer 15 shows a tensile strain of −0.4%.

The barrier layers 14a, 16a of the MQB structures 14, 16 of this example are made of nondoped $In_{0.47}Al_{0.31}Ga_{0.22}As$ having a tensile strain of 0.4%, whereas their well layers 14b, 16b are made of $Ga_{0.32}In_{0.68}As$ having a compressive strain of 1%.

The semiconductor laser device of Example 5 has the same characteristics as those described above in Examples 1 and 4. In addition, it has even deeper quantum wells and a stronger effect of confining carriers because the MQB layer of the MQW active layer 15 and the MQB layers 14, 16.

EXAMPLE 6

Figure 7:
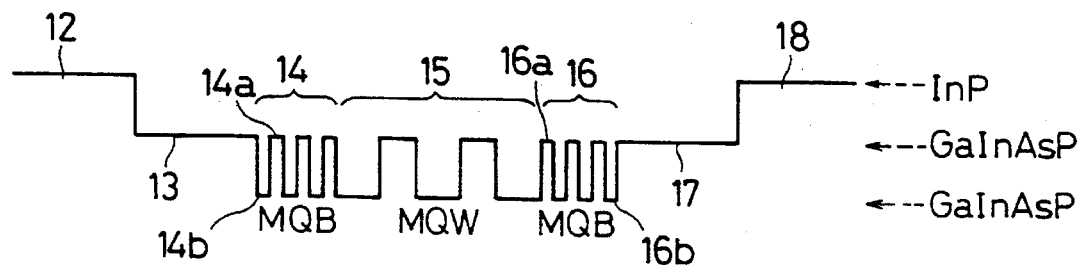
FIG. 7 is a schematic illustration of the energy band diagram for conduction band of the semiconductor laser device of Example 6 as described hereinafter.

FIG. 7 shows the energy band diagram for conduction band of the device of this example (lasing wavelength: 1.0 to 2.0 μm).

In this example, the semiconductor laser device according to the invention have components same structure as those described above in Example 5, except for those point that the active layer 15 has a MQW structure, the optical confinement layers 13, 17 are made of GaInAsP and the barrier layers 14a, 16a and the well layers 14b, 16b of the multi quantum barrier (MQB) structures 14, 16 are made of GaInAsP. Note, however, that the well layers 14b, 16b have band gaps narrower than those of the barrier layers 14a, 16a, respectively.

The semiconductor laser device of Example 6 has the same characteristics as those described above in Examples 1, 4 and 5. It has additional advantages, for example, including that it is free from the problem of oxidation of regrown interfaces due to aluminum oxide.

EXAMPLE 7

Figure 8:
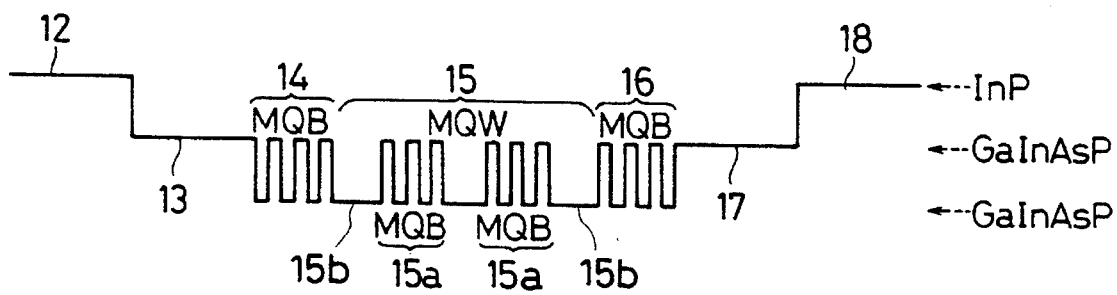
FIG. 8 is a schematic illustration of the energy band diagram for conduction band of the semiconductor laser device of Example 7 as described hereinafter.

FIG. 8 shows the energy band diagram for conduction band of the device of this example (lasing wavelength: 1.0 to 2.0 μm).

In this example, the semiconductor laser device according to the invention have same structure as described above for Example 6, except for a point that the barrier layer of the MQW active layer 15 has multiquantum barrier (MQB) structures 15a, 15b.

Since in the semiconductor laser device of Example 7, the barrier layers of the MQW active region 15 comprise MQB structures 15a, the carrier confinement effect of the device to the MQW wells is improved when compared with a device having MQB structures only in the optical confinement layers. In addition, it has an optical confinement coefficient greater than that of a device which does not comprise MQB structures to the barriers of MQW and has its barrier height elevated bulk barrier only.

Thus, a semiconductor laser device having a component as prescribed in Example 7 has a high responsiveness and an improved gain characteristics.

EXAMPLE 8

Figure 9:
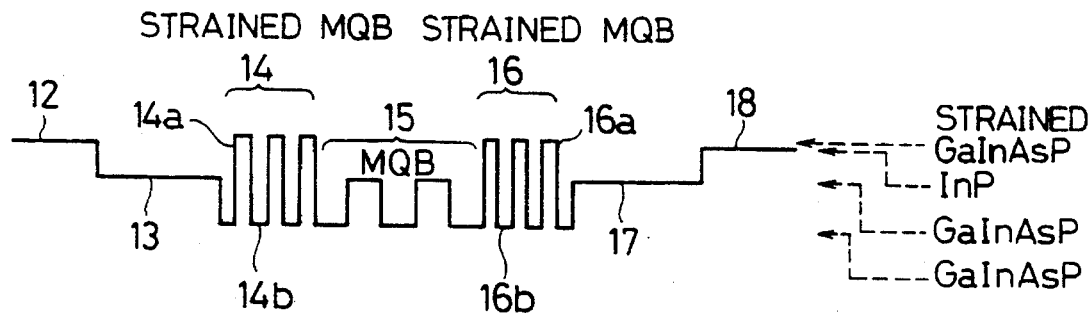
FIG. 9 is a schematic illustration of the energy band diagram for conduction band of the semiconductor laser device of Example 8 as described hereinafter.
Figure 10:
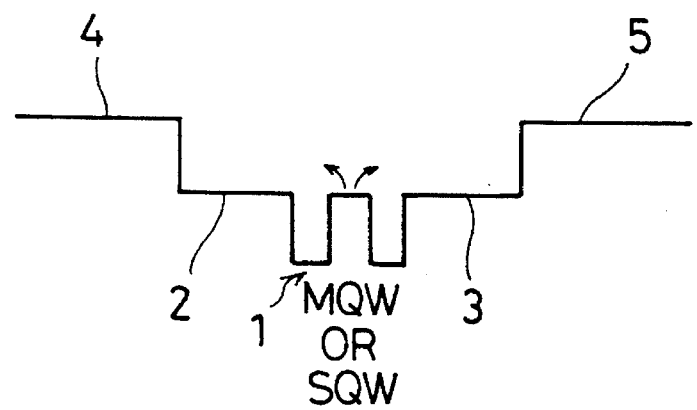
FIG. 10 is a schematic illustration of the energy band diagram for conduction band of a conventional MQW or SQW semiconductor laser device.
Figure 11:
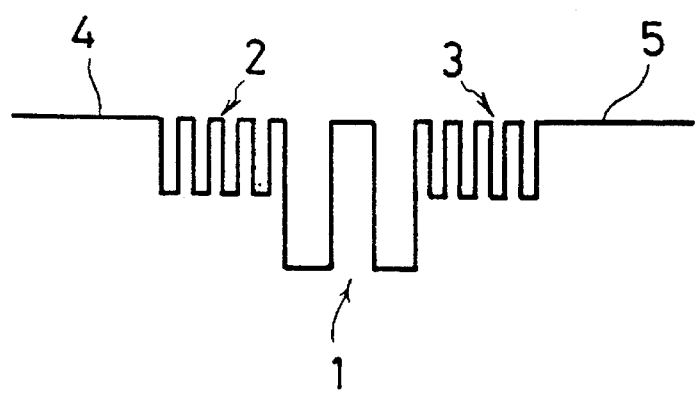
FIG. 11 is a schematic illustration of the energy band diagram for conduction band of another conventional MQW or SQW semiconductor laser device.
Figure 12:
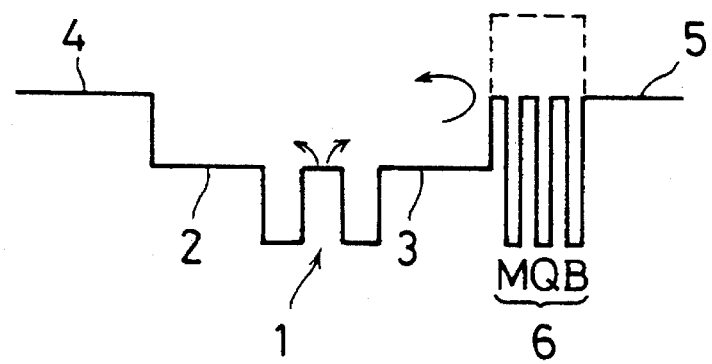
FIG. 12 is a schematic illustration of the energy band diagram for conduction band of still another conventional MQW or SQW semiconductor laser device.

FIG. 9 shows the energy band diagram for conduction band of the device of this example (lasing wavelength: 1.0 to 2.0 μm).

In this example, the components of a semiconductor laser device according to the invention have same structure as those described above for Example 6, except for only a point that the multiquantum barrier (MQB) structures 14, 16 consist of strained layer superlattice structures.

The semiconductor laser device of Example 8 has the same characteristics as those described above. In addition, it has an improved carrier confining effect because the strained MQB structures 14, 16 produce enhanced effective barriers.

It should be noted here that a semiconductor optical device according to the invention can be made to have technological features as described in the summary of the invention and the above embodiment and examples in any combination thereof and any of the features of such a combination may be partly or entirely replaced by other features so long as they are mutually compatible. Therefore, a semiconductor optical device according to the invention is not limited to any particular examples of semiconductor lasers described above.

For an example of the devices, this invention can be applied to semiconductor optical amplifier. As for material, this invention can also be applied to AlInSbAs system or ZnSSe system.

ADVANTAGES OF THE INVENTION

A semiconductor optical device according to the invention has, among others, the following advantages.

Since a semiconductor laser device according to the invention comprises optical confinement layers and clad layers arranged on and under an active layer produce an SCH structure and the optical confinement layers have multiquantum barrier (MQB) structures as part thereof, the barrier height of the optical confinement layers against electrons in the active layer is increased while maintaining a large optical confinement coefficient. With such improvements, it can effectively suppress any overflow of carriers from the active layer into the optical confinement layers and further into the p-clad layer to produce a low threshold current, an improved temperature dependency, an enhanced optical output power and an improved high-speed modulation performance.

Since the optical confinement layers comprise MQB structures only as part thereof, the number of heterointerfaces of the device is by far smaller than that of a device having a superlattice SCH feature. Therefore, if a semiconductor laser device according to the invention is made to comprise SCH and MQB structures, it is free from deterioration in the laser oscillation performance and hence operates highly effectively and efficiently.

If the active layer of a semiconductor laser device according to the invention has a single quantum well (SQW) type or multiquantum well (MQW) type structure, the laser threshold current of the device is further reduced while raising the efficiency of its optical output to improve the performance of the device.

If the SCH structure of a semiconductor laser device is a GRIN (graded Index)-SCH structure, the internal electric field within the GRIN region can accelerate carriers to the active layer so that the device can have a high speed modulation capability and a superior gain characteristic.

If a semiconductor laser device according to the invention comprises clad layers and MQB layers containing aluminum as a component and the MQB layers are made to contain aluminum in average to a concentration lower than the aluminum concentration of the clad layers, the device can show an improved performance, significantly or totally avoiding undesirable effects of aluminum oxidization.

If a semiconductor laser device has MQB structures comprising a strained layer superlattice structures, the effective height of the barriers of the MQB structures can be increased to further improve the optical confinement effect of the device.

If the active layer of a semiconductor laser device according to the invention has a multi quantum well (MQW) type structure and its barrier layers of MQW have MQB structures, any overflow of carriers can be further reduced due to the synergetic effect of the high barriers of the above MQBs and those of the MQB structures of the optical confinement layers. Such a device shows an improved temperature stability, a very fast modulation capability and an enhanced gain characteristic.

What is claimed is:

1. A semiconductor optical device comprising an active layer, upper and lower optical confinement layers and upper and lower cladding layers formed on a semiconductor substrate, said active layer being sandwiched by said upper and lower optical confinement layers, said lower and upper cladding layers being arranged under said lower optical confinement layer and on said upper optical confinement layer, respectively, to form an SCH structure, wherein at least one of said optical confinement layers include multiquantum barrier (MQB) structures as part thereof.

2. A semiconductor optical device according to claim 1, wherein said SCH structure is a GRIN-SCH structure.

3. A semiconductor optical device according to claim 1, wherein said active layer consists of the multiquantum well (MQW) type, the barrier layer(s) of the MQW also comprising the multiquantum barrier (MQB) structure.

4. A semiconductor optical device according to claim 1, wherein said active layer comprising either of the SQW (Single Quantum Well), MQW, strained layer, strained layer quantum well or strain compensated type.

5. A semiconductor optical device according to claim 1, wherein the multiquantum barrier (MQB) structures comprise a strained superlattice structure.

6. A semiconductor optical device according to claim 1, wherein the multiquantum barrier (MQB) structures comprised in the optical confinement layers as part thereof comprise a plurality of barrier layers having an energy band gap that decreases as it comes closer to the active layer.

7. A semiconductor optical device according to claim 1, wherein the barrier layers comprised in the multiquantum barrier (MQB) structures as part thereof including layer(s) with a band gap greater than those of the areas of the optical confinement layers other than the multiquantum barrier (MQB) structure.

8. A semiconductor optical device according to claim 1 for operating with a wavelength region of 0.7 to 1.2 µm comprising an active layer, a pair of optical confinement layers at least one of which having the multiquantum barrier (MQB) structures and a pair of $Al_xGa_{1-x}As$ clad layers formed on a GaAs semiconductor substrate, said clad layers latticematching with the substrate, characterized in that the optical confinement layers are made of $Al_yGa_{1-y}As$ ($0 \leq y \leq x$), the barriers of MQB layers are made of $In_zAl_wGa_{1-z-w}As$ ($0 \leq z < 1$, $0 \leq w < x$) and the wells of MQB well layers are made of $In_aAl_bGa_{1-a-b}As$ ($0 \leq a < 1$, $0 \leq b < x$) having a band gap smaller than that of the MQB layers.

9. A semiconductor optical device according to claim 1, for operating with a wavelength region of 0.7 to 1.2 µm comprising an active layer, a pair of optical confinement layers at least one of which having the multiquantum barrier (MQB) structures and a pair of $Ga_xIn_{1-x}As_yP_{1-y}$ cladding layers formed on a GaAs semiconductor substrate, said clad layers latticematching with the substrate, characterized in that the optical confinement layers are made of $Ga_zIn_{1-z}As_wP_{1-w}$, the barriers of MQB layers are made of $Ga_aIn_{1-a}As_bP_{1-b}$ and the wells of MQB layers are made of $Ga_cIn_{1-c}As_dP_{1-d}$ having a band gap smaller than that of the barrier layers of MQB.

10. A semiconductor optical device according to claim 1, for operating with a wavelength region of 0.6 to 0.65 µm comprising an active layer, a pair of optical confinement layers at least one of which having the multiquantum barrier (MQB) structures and a pair of $Al_xGa_{0.5-x}In_{0.5}P$ cladding layers formed on a GaAs semiconductor substrate, said clad layers latticematching with the substrate, characterized in that the optical confinement layers are made of $AlGa_wIn_{1-z-w}P$ ($0 \leq z \leq x$), the barriers of MQB layers are made of $Al_aGa_dIn_{1-a-b}P$ ($0 \leq z < x$), and the wells of MQB layers are made of $Ga_cIn_{1-c}As_DP_{1-D}$ having a band gap smaller than that of the barrier layers of MQB.

11. A semiconductor optical device according to claim 1, for operating with a wavelength region of 1.0 to 2.0 µm comprising an active layer, a pair of optical confinement layers at least one of which having the multiquantum barrier (MQB) structures and a pair of $In_xAl_yGa_{1-x-y}As_zP_{1-z}$ cladding layers formed on an InP semiconductor substrate, said cladding layers latticematching with the substrate, characterized in that the optical confinement layers are made of $In_aAl_bGa_{1-a-b}As_cP_{1-c}$, the barriers of MQB layers are made of $In_DAl_EGa_{1-D-E}As_FP_{1-F}$ and the wells of MQB layers are made of $In_tAl_uGa_{1-t-u}As_vP_{1-v}$ having a band gap smaller than that of the barrier layers of MQB.

12. A semiconductor optical device according to claim 1 wherein barrier layers of the multiquantum barrier structures contain aluminum as a component thereof and the multiquantum barrier structures contain aluminum in average to a concentration lower than that of the aluminum concentration of the lower and upper clad layers.

* * * * *